(12) United States Patent
Eom (10) Patent No.: US 8,766,452 B2
(45) Date of Patent: Jul. 1, 2014

(54) SEMICONDUCTOR DEVICE INCLUDING CONDUCTIVE LINES AND PADS

(75) Inventor: Dae Sung Eom, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/593,992

(22) Filed: Aug. 24, 2012

(65) Prior Publication Data

US 2013/0049211 A1 Feb. 28, 2013

(30) Foreign Application Priority Data

Aug. 25, 2011 (KR) .......................... 10-2011-0085084

(51) Int. Cl.
*H01L 23/48* (2006.01)
*H01L 21/768* (2006.01)

(52) U.S. Cl.
USPC .............. 257/773; 257/E23.01; 257/E21.575; 257/E23.019; 257/E27.046; 257/E27.098; 257/698; 257/203; 257/202; 257/207; 257/208; 257/211; 257/314

(58) Field of Classification Search
USPC ............ 257/773, E23.01, E21.575, 698, 203, 257/202, 208, 207, 211, E27.046, E23.019, 257/314, E27.098
See application file for complete search history.

(56) References Cited

U.S. PATENT DOCUMENTS

| 8,304,886 | B2 * | 11/2012 | Kim | 257/692 |
| 8,310,055 | B2 * | 11/2012 | Park et al. | 257/773 |
| 8,482,138 | B2 * | 7/2013 | Hwang et al. | 257/786 |
| 2009/0263749 | A1 * | 10/2009 | Sim et al. | 430/319 |
| 2009/0290403 | A1 * | 11/2009 | Tamon | 365/51 |
| 2010/0244269 | A1 * | 9/2010 | Kim | 257/773 |
| 2011/0095338 | A1 * | 4/2011 | Scheuerlein et al. | 257/202 |
| 2011/0115010 | A1 * | 5/2011 | Shim et al. | 257/314 |
| 2011/0249497 | A1 * | 10/2011 | Yun | 365/185.05 |
| 2012/0034784 | A1 * | 2/2012 | Min et al. | 438/700 |

* cited by examiner

*Primary Examiner* — Alexander Oscar Williams
(74) *Attorney, Agent, or Firm* — IP & T Group LLP (57) ABSTRACT

A semiconductor device having a conductive pattern includes a plurality of conductive lines extending in parallel, each having a first region extending in a first direction and a second region coupled to the first region and extending in a second direction crossing the first direction, and a plurality of contact pads, each coupled to a respective conductive line of the second regions, wherein the conductive lines are grouped and arranged in a plurality of groups, the first region of a first group is longer than the first region of a second group, and the second region of the first group and the second region of the second group are spaced apart from each other.

6 Claims, 13 Drawing Sheets

SEMICONDUCTOR DEVICE INCLUDING CONDUCTIVE LINES AND PADS

CROSS-REFERENCE TO RELATED APPLICATION

This application is based on and claims priority from Korean Patent Application No. 10-2011-0085084, filed on Aug. 25, 2011, with the Korean Intellectual Property Office, the disclosure of which is incorporated herein in its entirety by reference.

BACKGROUND

The present invention relates to a semiconductor device and a method of manufacturing the semiconductor device, and more particularly to a semiconductor device including a conductive pattern and a method of manufacturing the semiconductor device.

According to the fineness and the high-integration of a semiconductor device in a recent time, in order to form more patterns within a limited region, it is necessary to reduce a line width and a space width of the pattern. The pattern is typically formed by using a photo lithography process, but the photo lithography may have a limitation in reducing a line width and a space width of the pattern due to an intrinsic resolution limit.

In order to form a fine pattern having a fine width over the intrinsic resolution limit in the photo lithography process, a double patterning technology of forming a fine pattern by using the patterns doubly overlapped and a spacer patterning technology of forming a fine pattern by using a spacer have been suggested.

In the meantime, a semiconductor device includes a plurality of metal wires and a plurality of contact pads connected to the plurality of metal wires. Accordingly, a layout for effectively aligning the plurality of metal wires and the plurality of contact pads in a narrow area may be desirable.

SUMMARY

Exemplary embodiments of the present invention provides a semiconductor device which is capable of effectively arranging a plurality of conductive lines and a plurality of contact pads, and a method of manufacturing the semiconductor device.

An exemplary embodiment of the present invention provides a semiconductor device including: a plurality of conductive lines extending in parallel and each having a first region extending in a first direction and a second region coupled to the first region and extending in a second direction crossing the first direction, and a plurality of contact pads each coupled to the second region of a respective one conductive lines, wherein the plurality of conductive lines are grouped and arranged in a plurality of groups, the first region of a first group is longer than the first region of a second group, and the second region of the first group and the second region of the second group are spaced apart from each other.

Another exemplary embodiment of the present invention provides a method of manufacturing a semiconductor device, including forming a mask pattern for conductive lines and contact pads on a conductive layer, and forming a plurality of conductive lines extending in parallel by etching the conductive layer using mask patterns for the conductive lines and contact pads as etch barriers, wherein each of conductive lines include a first region extending in a first direction and a second region coupled to the first regions and extending in a second direction crossing the first direction and each of contact pads connected to a respective second region of conductive lines, wherein the plurality of conductive lines are grouped and arranged in a plurality of groups, the first region of a first group is longer than the first region of a second group, and the second region of the first group and the second region of the second group are spaced apart from each other.

According to the exemplary embodiments of the present invention, the bent conductive lines are formed and the plurality of conductive lines are grouped into the groups and arranged, so that it is possible to minimize interference between the adjacent memory blocks and improve a degree of integration of the memory devices. Especially, the contact pads are arranged in the spaces between the conductive lines, so that it is possible to efficiently arrange the plurality of conductive lines and the plurality of pads in a narrow area. Accordingly, the plurality of conductive lines and the plurality of pads can be regularly arranged without space, so that it is not necessary to form a dummy line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, an exemplary embodiment of the present invention will be described. In the drawings, thicknesses and intervals of elements are exaggerated for convenience of illustration. In the following description, detailed explanation of known related functions and configurations may be omitted to avoid unnecessarily obscuring the subject matter of the present invention. In the following description, the same elements will be designated by the same reference numerals although they are shown in different drawings.

Figure 1A:
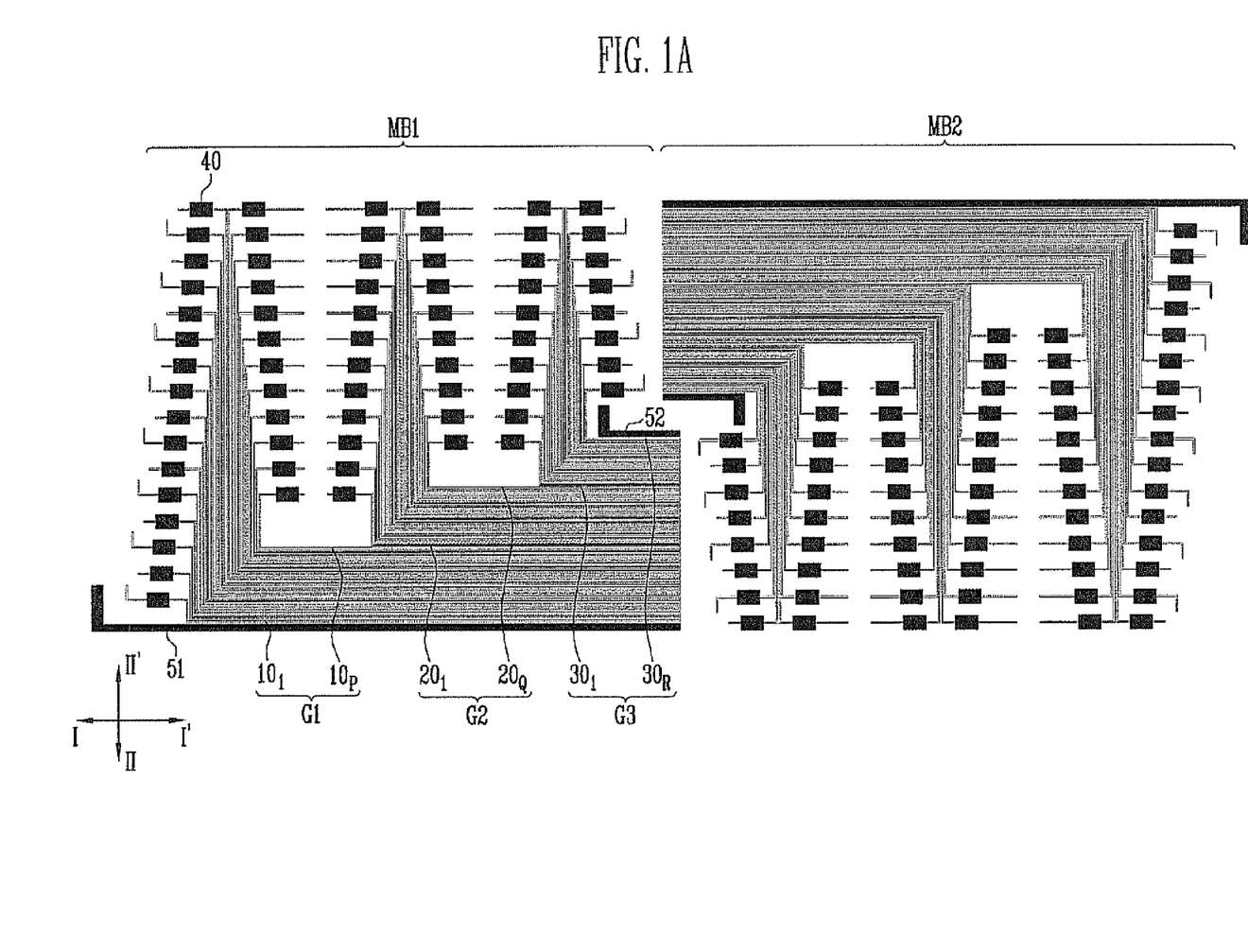
FIG. 1A is a plan view illustrating a semiconductor device according to an exemplary embodiment of the present invention, and illustrates a region in which a plurality of conductive lines and a plurality of contact pads are formed.

FIG. 1A is a plan view illustrating a semiconductor device according to an exemplary embodiment of the present invention, and illustrates a region in which a plurality of conductive lines and a plurality of contact pads are formed.

As illustrated in FIG. 1A, the semiconductor device according to the exemplary embodiment of the present invention includes a plurality of memory blocks MB1 and MB2. Each of the memory blocks MB1 and MB2 includes a plurality of conductive lines $10_1$ to $30_R$ having a bent shape, like "L", and extending in parallel and a plurality of contact pads 40 connected to distal ends of the plurality of conductive lines $10_1$ to $30_R$. Here, the conductive lines $10_1$ to $30_R$ may be word lines.

Further, each of the memory blocks MB1 and MB2 further includes conductive lines 51 and 52, each having a wider width than that of each of the conductive lines $10_1$ to $30_R$ in one side and the other side of the plurality of conductive lines $10_1$ to $30_R$. The conductive lines 51 and 52 may be a drain selection line and a source selection line.

According to the aforementioned layout, each of the memory blocks MB1 and MB2 have a bent shape like "L", and the memory blocks are arranged in an overlapping form by rotating the adjacent memory blocks MB1 and MB2 by 180°, thereby further improving a degree of integration of a memory device.

Hereinafter, forms and layouts of the plurality of conductive line $10_1$ to $30_R$ included in the first memory block MB1 will be described in detail.

The plurality of conductive line $10_1$ to $30_R$ included in one memory block MB1 is grouped into a plurality of groups $G_1$ to $G_M$ and arranged, and the number of conductive lines included in each of the groups $G_1$ to $G_M$ may be the same or different. In the present embodiment, as an example, a case in which the plurality of conductive lines $10_1$ to $30_R$ are divided into the three groups $G_1$ to $G_3$, and a first group $G_1$ includes P number of conductive lines $10_1$ to $10_P$, a second group $G_2$ includes Q number of conductive lines $20_1$ to $20_Q$, and a third group $G_3$ includes R number of conductive lines $30_1$ to $30_R$ will be described. Further, for the illustrative purpose, the conductive lines included in the first group $G_1$ are called first conductive lines $10_1$ to $10_P$, the conductive lines included in the second group $G_2$ are called second conductive lines $20_1$ to $20_Q$, and the conductive lines included in the third group $G_3$ are called third conductive lines $30_1$ to $30_R$. Here, P, Q, and R represent natural numbers.

Figure 1B:
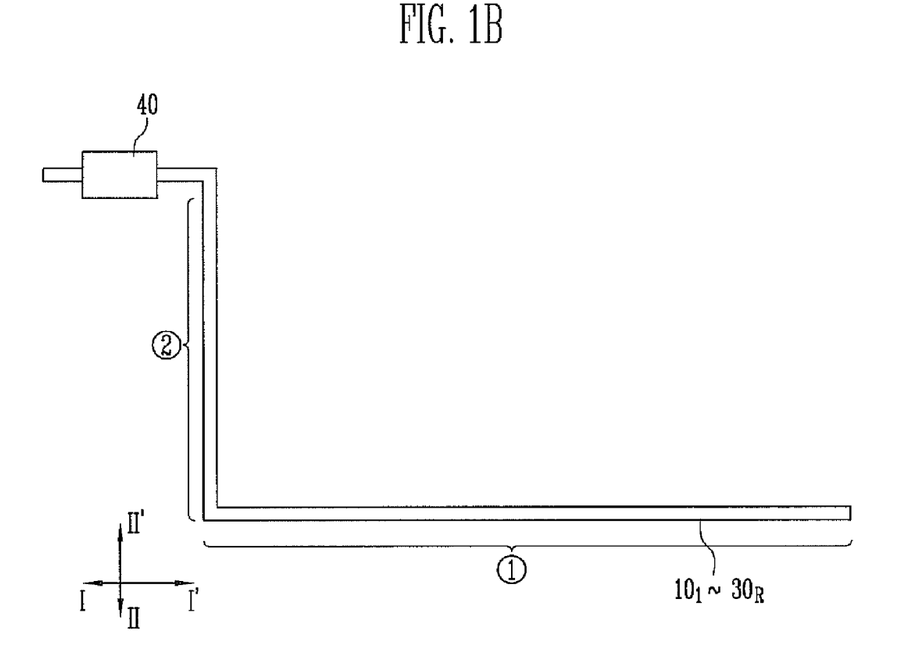
FIG. 1B is an enlarged view illustrating one conductive line shown in FIG. 1A.

FIG. 1B is an enlarged view illustrating one conductive line.

As illustrated in FIG. 1B, the respective conductive lines $10_1$ to $30_R$ includes a first region ① extending in a first direction I-I' and a second region ② connected to the first region ① and extending in a second direction II-II' crossing the first direction I-I'.

Here, a contact pad 40 is connected to the second region ②. Although FIG. 1B illustrates a case in which the contact pad 40 is connected in the negative first direction I-I', but the contact pad 40 may be connected to the positive first direction I-I'.

Hereinafter, referring to FIGS. 1A and 1B, the layout of the plurality of conductive lines $10_1$ to $30_R$ and the plurality of contact pads 40 will be described in detail.

According to the present invention, the plurality of conductive lines $10_1$ to $30_R$ are arranged in such a manner that in each of the first regions ① and the second regions ②, the conductive lines $10_1$ to $30_R$ are extend in parallel. In this case, in order to uniformly arrange the plurality of conductive lines $10_1$ to $30_R$ and the plurality of contact pads 40 without a wasted space, the first regions ① and the second regions ② of the respective conductive lines $10_1$ to $30_R$ are adjusted in length, and a direction in which the second region ② is connected to the contact pad 40 is adjusted. Accordingly, lengths of the first region ① and the second region ② are different for each of the groups G1 to G3, and even though the conductive lines $10_1$ to $30_R$ are included in one group of the groups G1 to G3, lengths of the first region ① and the second region ② are different for each of the conductive lines $10_1$ to $30_N$.

The first group $G_1$ to an $M^{th}$ group $G_M$ are sequentially arranged, and the first regions ① of the first conductive lines $10_1$ to $10_P$ included in the first group $G_1$ is longer than the first regions ① of the second conductive lines $20_1$ to $20_Q$ included in the second group $G_2$. Accordingly, the second regions ② of the first conductive lines $10_1$ to $10_P$ included in the first group $G_1$ and the second regions ② of the second conductive lines $20_1$ to $20_Q$ included in the second group $G_2$ are spaced apart from each other, and the plurality of contact pads 40 connected to the second regions ② of the plurality of conductive lines $10_1$ to $30_R$ are arranged in spaces between the adjacent groups $G_1$ to $G_N$.

The conductive lines $10_1$ to $10_P$ included in the one group $G_1$ are bisymmetrically arranged based on the conductive line positioned at a center thereof. Especially, the second region ② of the center conductive line protrudes the most, or has a substantially longest length in the second direction II-II', and as the conductive line is positioned at the outer side, the conductive line less protrudes, or has a shorter length than the center conductive line in the second direction II-II'. In this case, the second regions ② of each group $G_1$ have a bisymmetric triangular form.

Further, the conductive lines formed in a left side based on the center conductive line are connected with the contact pads 40 in the left side (the negative first direction), and the conductive lines formed in a right side based on the center conductive line are connected with the contact pads 40 in the right side (the positive first direction). Accordingly, the contact pads 40 are arranged in the spaces between the adjacent groups $G_1$ to $G_3$.

FIGS. 2A to 2G are plan views illustrating a method of forming the conductive lines and the contact pads of the semiconductor device according to an exemplary embodiment of the present invention, and FIGS. 3A to 3G are cross-sectional views illustrating a method of forming the conductive lines and the contact pads of the a semiconductor device according to an exemplary embodiment of the present invention.

Figure 2A:
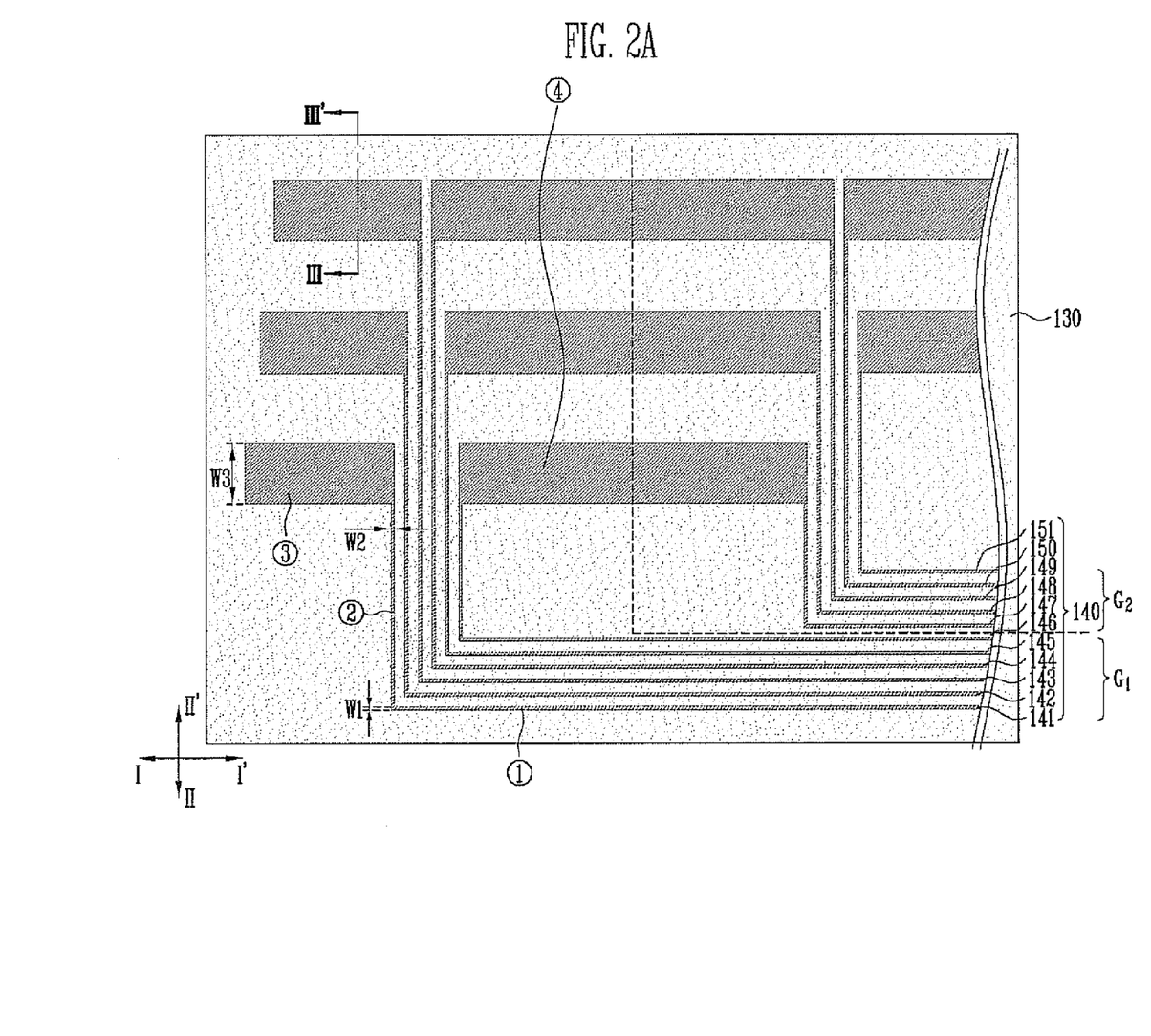
FIGS. 2A to 2G are plan views illustrating a method of forming conductive lines and contact pads of a semiconductor device according to an exemplary embodiment of the present invention.
Figure 3A:
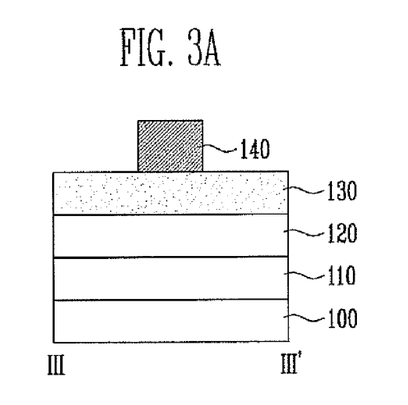
FIGS. 3A to 3G are cross-sectional views illustrating a method of forming conductive lines and contact pads of a semiconductor device according to an exemplary embodiment of the present invention.

As illustrated in FIGS. 2A and 3A, a conductive film 110, that is a layer to be etched, is formed on a substrate 100 in which a demanded lower structure is formed, and then a first hard mask film 120 and a second hard mask film 130 are sequentially formed.

Next, a first mask pattern 140 including a plurality of line patterns 141 to 151 is formed on the second hard mask film 130. The first mask pattern 140 is a sort of an auxiliary pattern used for forming a spacer of the spacer patterning technology (SPT) process. Accordingly, a line width and a space width of the line patterns 141 to 151 are determined considering a width of the spacer to be formed on a side wall of the first mask pattern 140.

The plurality of line patterns includes a first region ① extending in the first direction I-I', a second region ② connected with the first direction I-I' and extending in the second direction II-II', and a third region ③ connected to a distal end of the second region ②. The first region ① and the second region ② are provided for forming the conductive line, and have a first width W1 and a second width W2, respectively. Further, the third region ③ is provided for forming the contact pad and has a wider width W3 than those of the first region ① and the second region ②. The third region ③ may be connected to the distal end of the second region ② in the positive first direction I-I' or in the negative first direction I-I'.

The plurality of line patterns are grouped into a plurality of groups and arranged, and the number of line patterns 141 to 151 included in the respective groups may be the same or different. In the present embodiment, the first group $G_1$ includes, for example, six first line patterns 141 to 146 and the second group G₂ includes, for example, five second line patterns 147 to 151.

The first region ① of the first group G₁ is longer than the first region ① of the second group G₂. Accordingly, the second region ② of the first group G₁ and the second region ② of the second group G₂ are spaced apart from each other, and the third region ③ connected to the second region ② is formed in the space between the second regions ② of the adjacent groups G₁ and G₂.

In this case, the third regions ③ of the adjacent groups G₁ and G₂ may be separated from or connected to each other. Reference number ④ represents a case in which the third regions ③ of the adjacent groups G₁ and G₂ are connected to each other. An error may be generated in a bent region or an edge region of the pattern used in forming the mask pattern, and an optical proximity correction is performed in order to correct such an error. Accordingly, by connecting the third regions ③ of the adjacent groups G₁ and G₂ to each other, it may be not necessary to correct the possible error in the shape of the edge region.

Further, the line patterns 141 to 146 included in the one group G₁ are bisymmetrically formed based on the line patterns 143 and 144 positioned at the center thereof. Especially, the second regions ① of the center conductive lines 143 and 144 protrudes the most in the second direction II-II', and as the conductive lines 141, 142, 145, and 146 are positioned at the outer side, the conductive lines less protrude in the second direction II-II'. In this case, the second regions ② of each group G₁ have a bisymmetric triangular form.

Figure 2B:
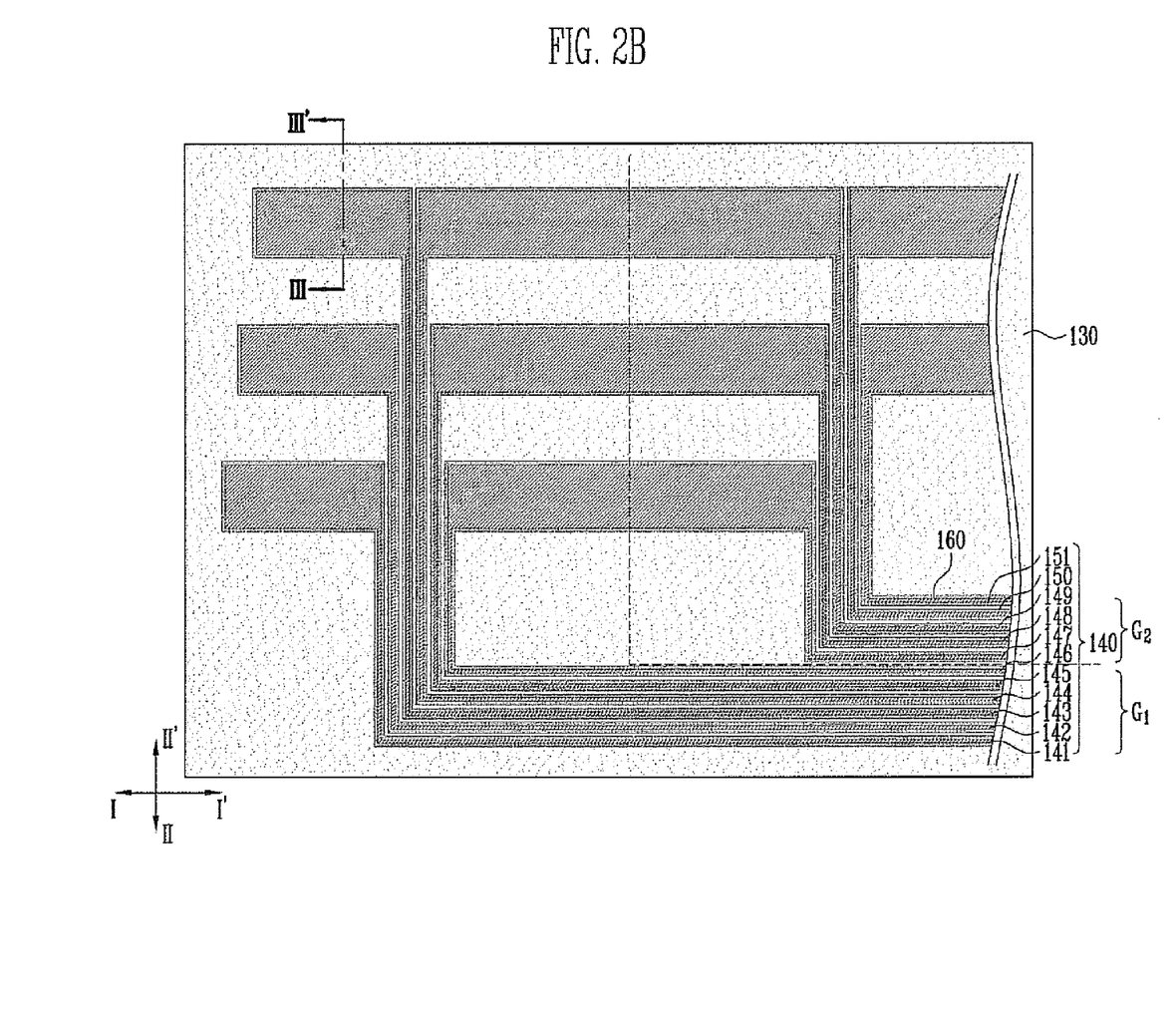
Figure 3B:
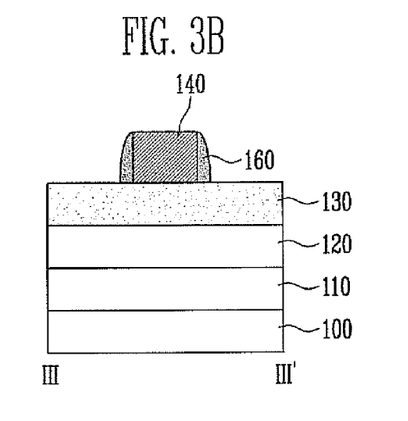

As illustrated in FIGS. 2B and 3B, a spacer 160 surrounding a side wall of the first mask pattern 140 is formed. For example, a material film for the spacer may be formed along the entire surface, where the first mask pattern 140 is formed, and then the spacer 160 may be formed by performing an etching process on the entire surface. The spacer 160 is provided for forming the conductive lines, and is formed so as to surround all of the first regions ①, the second regions ②, and the third regions ③ of the line patterns 141 to 151.

Figure 2C:
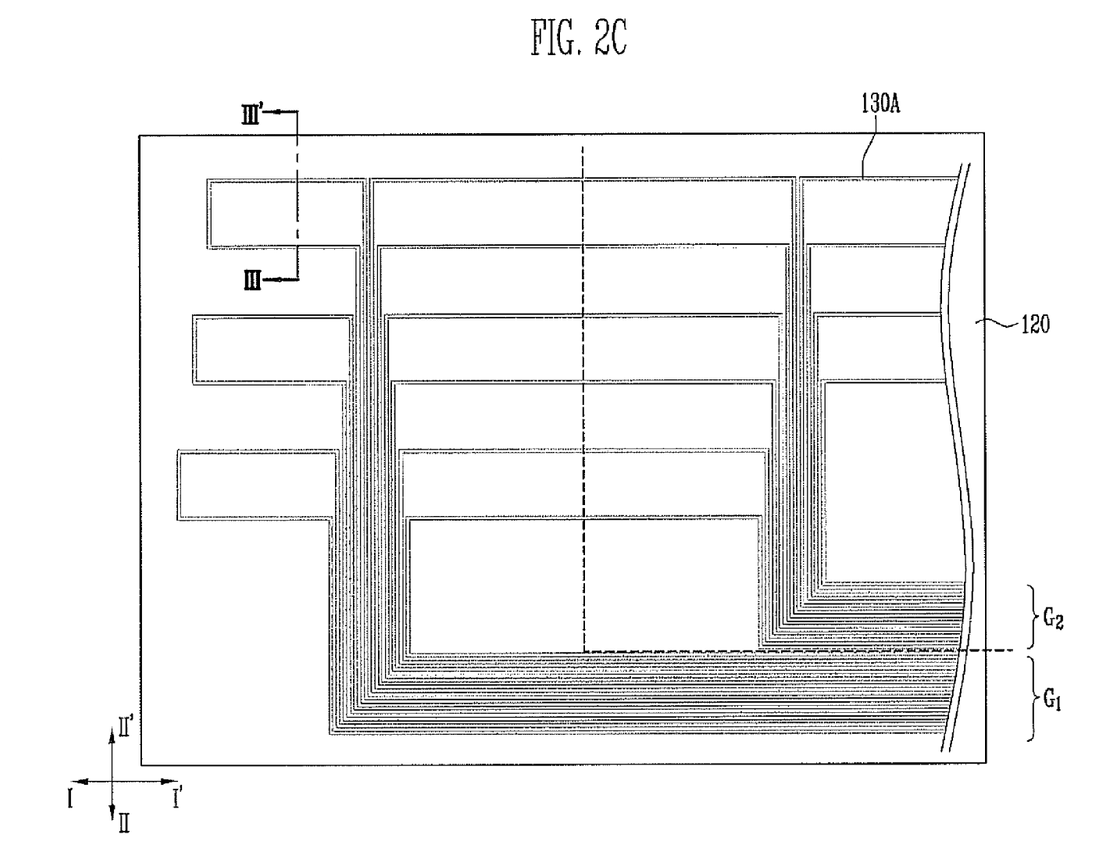
Figure 3C:
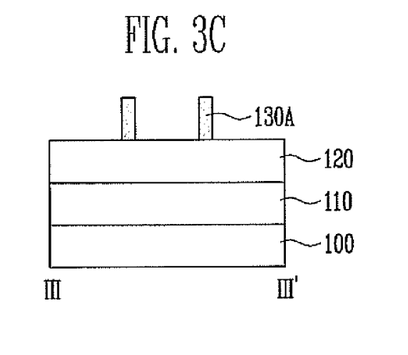

As illustrated in FIGS. 2C and 3C, the first mask pattern 140 is selectively removed while the spacer 160 is left. Subsequently, the second hard mask layer 130 is etched using the spacer 160 as an etch barrier, to form a second hard mask pattern 130A.

Figure 2D:
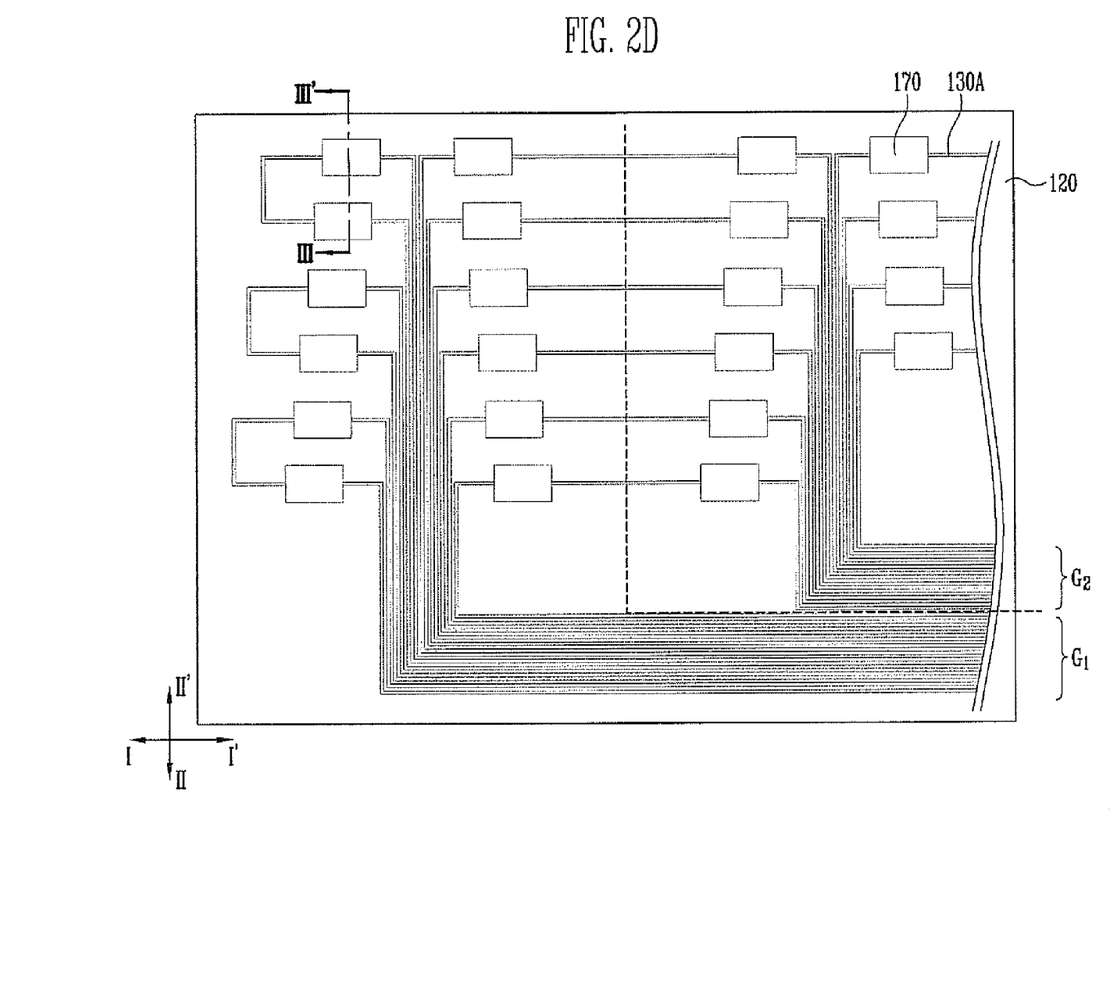
Figure 3D:
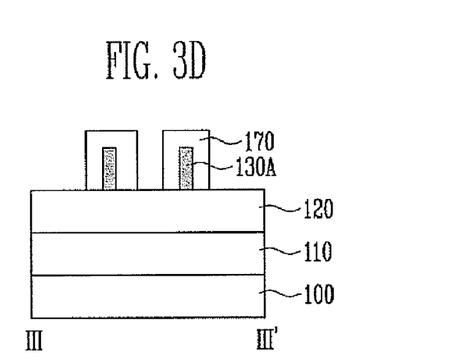

As illustrated in FIGS. 2D and 3D, a second mask pattern 170 for forming the contact pad is formed on the second hard mask pattern 130A. The second mask pattern 170 covers the second hard mask pattern 130A formed at a position surrounding the third regions ③ of the line patterns 140 and includes a plurality of island patterns having wider widths than that of the second hard mask pattern 130A. Here, the plurality of island patterns is positioned in the space between the first group G₁ and the second group G₂. The second mask pattern 170 may be a photoresist pattern.

Figure 2E:
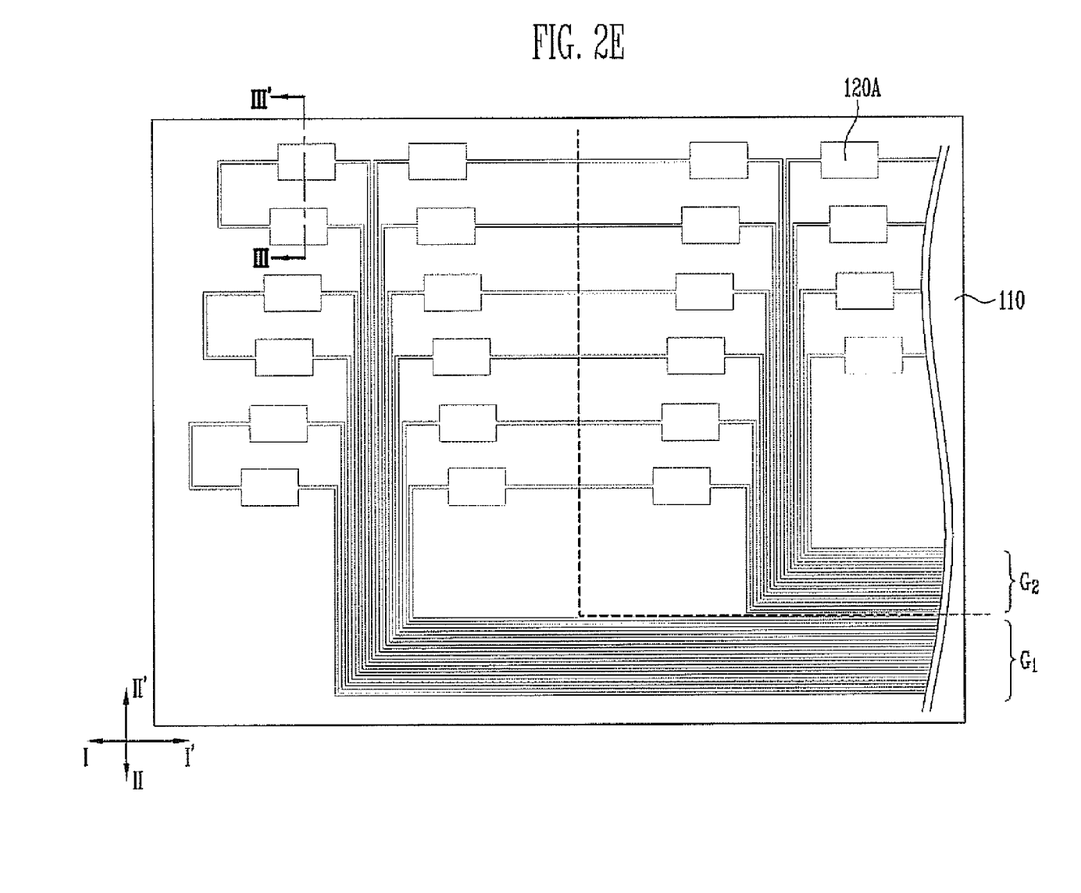
Figure 3E:
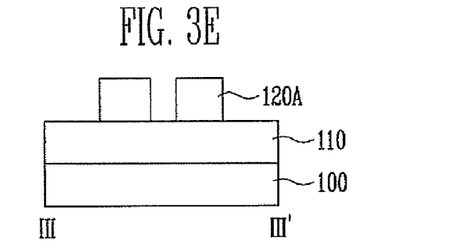

As illustrated in FIGS. 2E and 3E, the first hard mask layer 120 is etched using the second hard mask pattern 130A and the second mask pattern 170 as an etch barrier to form a first hard mask pattern 120A.

Figure 2F:
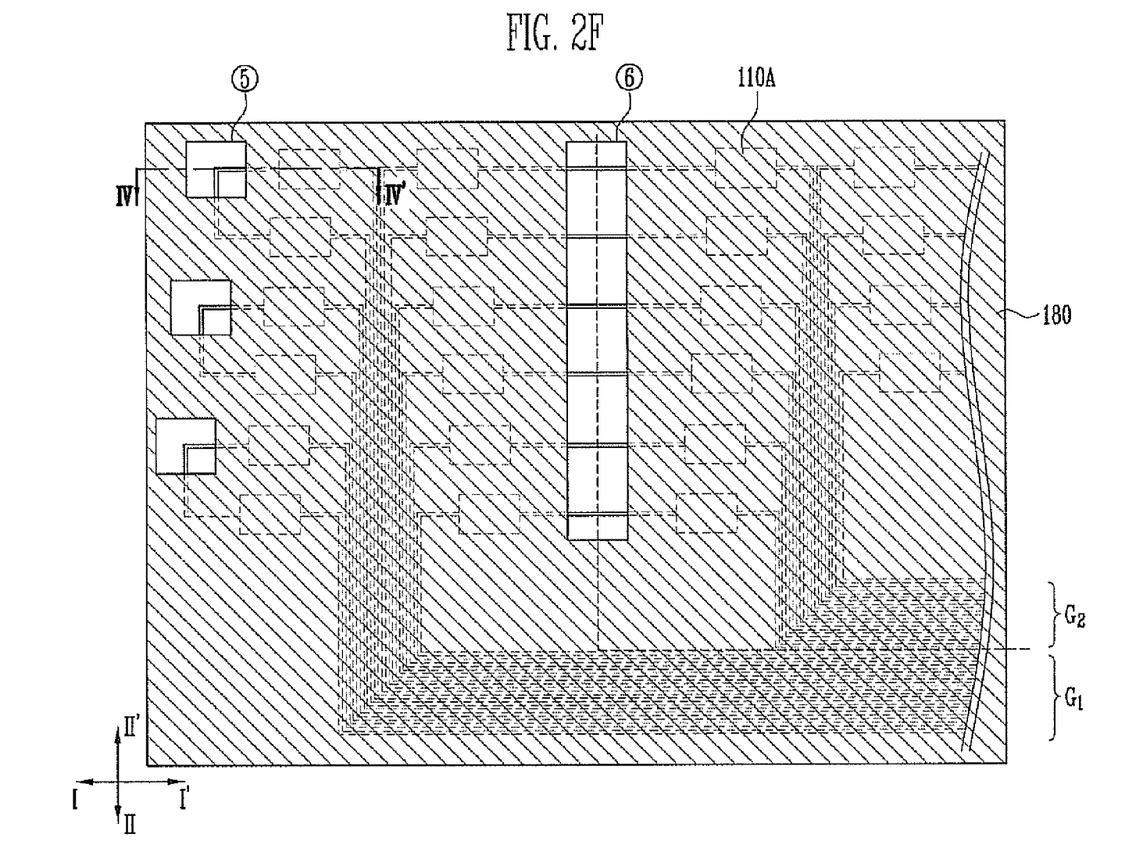
Figure 3F:
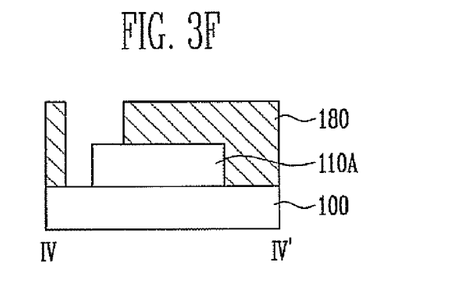

As illustrated in FIGS. 2F and 3F, a conductive layer 110 is etched using the first hard mask pattern 120A as an etch barrier, to form a conductive pattern 110A. Accordingly, the plurality of conductive lines including the first regions ① extending in the first direction I-I' and the second regions ② connected with the first regions ① and extending in the second direction II-IP, and the plurality of contact pads connected to the second regions ② of the plurality of conductive lines are formed. However, in the conductive pattern 110A, the adjacent contact pads are connected to each other by the conductive lines.

Next, a third mask pattern 180 is form on a resultant structure where the conductive pattern 110A is formed, and is used in etching the conductive lines connected between the contact pads. The third mask pattern 180 has a plurality of openings through which the conductive lines between the contact pads are exposed. For example, when the third regions ③ of the adjacent groups G₁ and G₂ are separated from each other in forming the first mask pattern 140, the third mask pattern 180 is formed so as to have the plurality of island-type openings ⑤ through which the conductive lines between the contact pads are exposed. For another example, when the third regions ③ of the adjacent groups G₁ and G₂ are connected to each other in forming the first mask pattern 140, the third mask pattern 180 is formed so as to have a plurality of line-shaped openings ⑥ through which the conductive lines between the contact pads are exposed. In this case, it is a matter of course that the island-type openings ⑤ for separating the contact pads of the group formed in the outer side are included together in the third mask pattern 180.

Figure 2G:
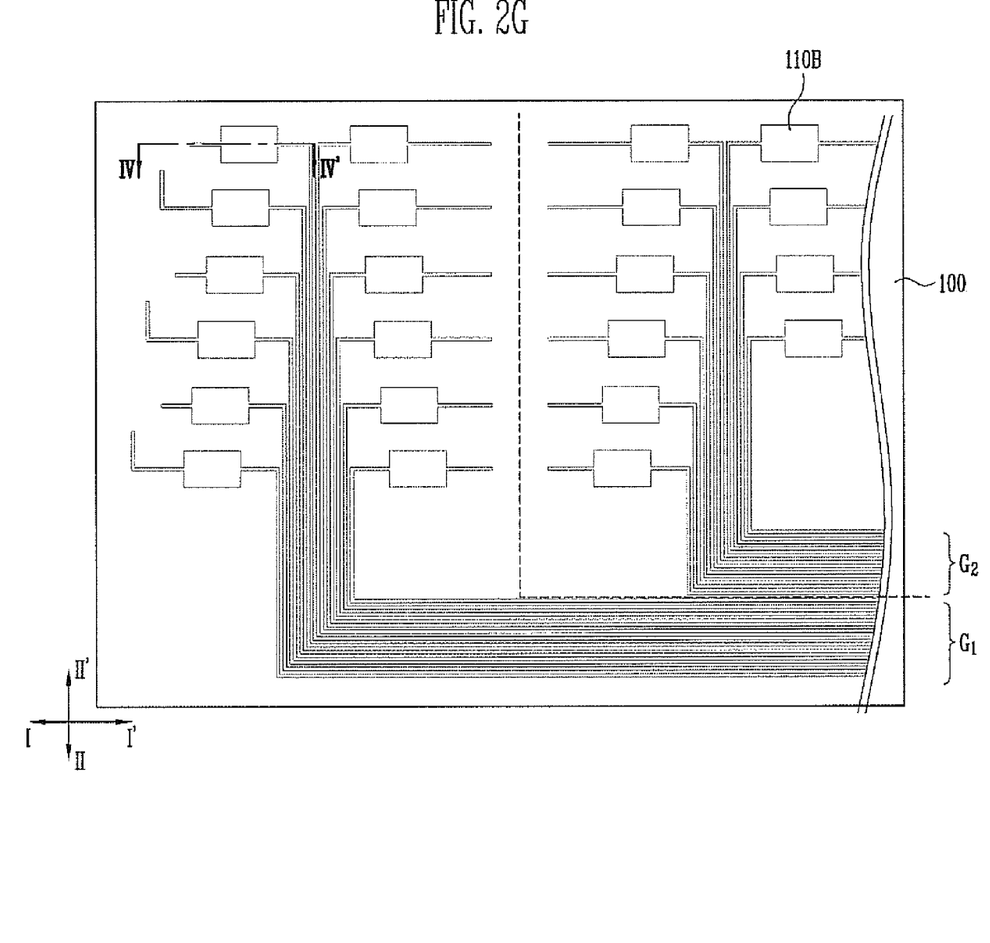
Figure 3G:
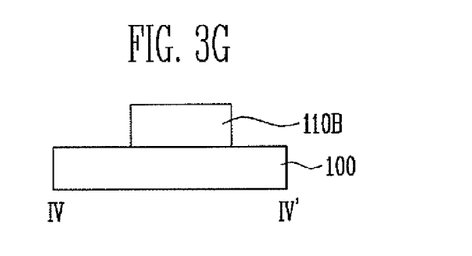

As illustrated in FIGS. 2G and 3G, the adjacent contact pads are electrically separated from each other by etching the conductive pattern 110A using the third mask pattern 180 as an etch barrier, so that a conductive pattern 1108 including the plurality of conductive lines and the plurality of contact pads are completely formed.

Figure 4:
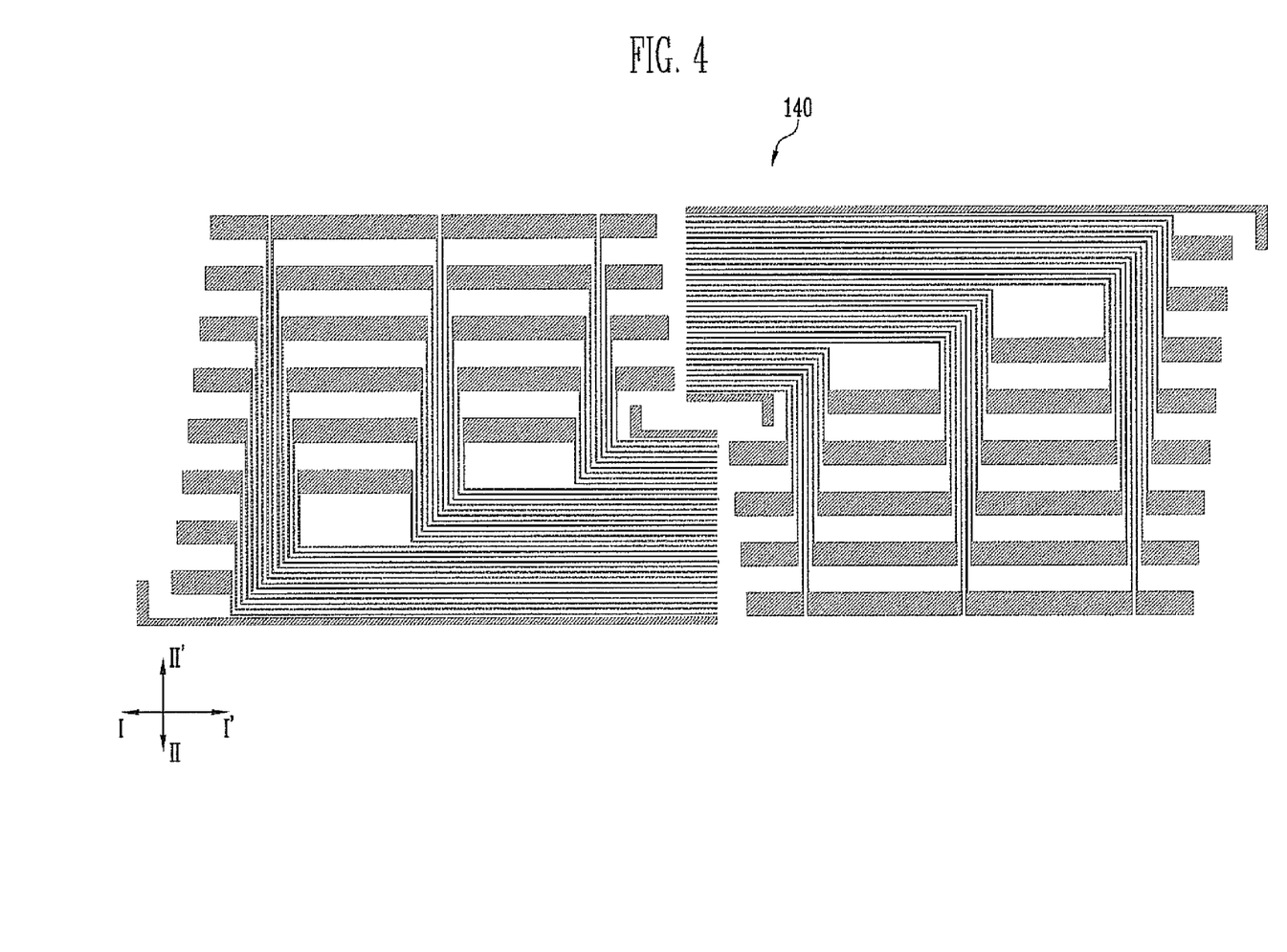
FIGS. 4 to 6 are diagrams illustrating a first mask pattern, a second mask pattern, and a third mask pattern according to an exemplary embodiment of the present invention.
Figure 5:
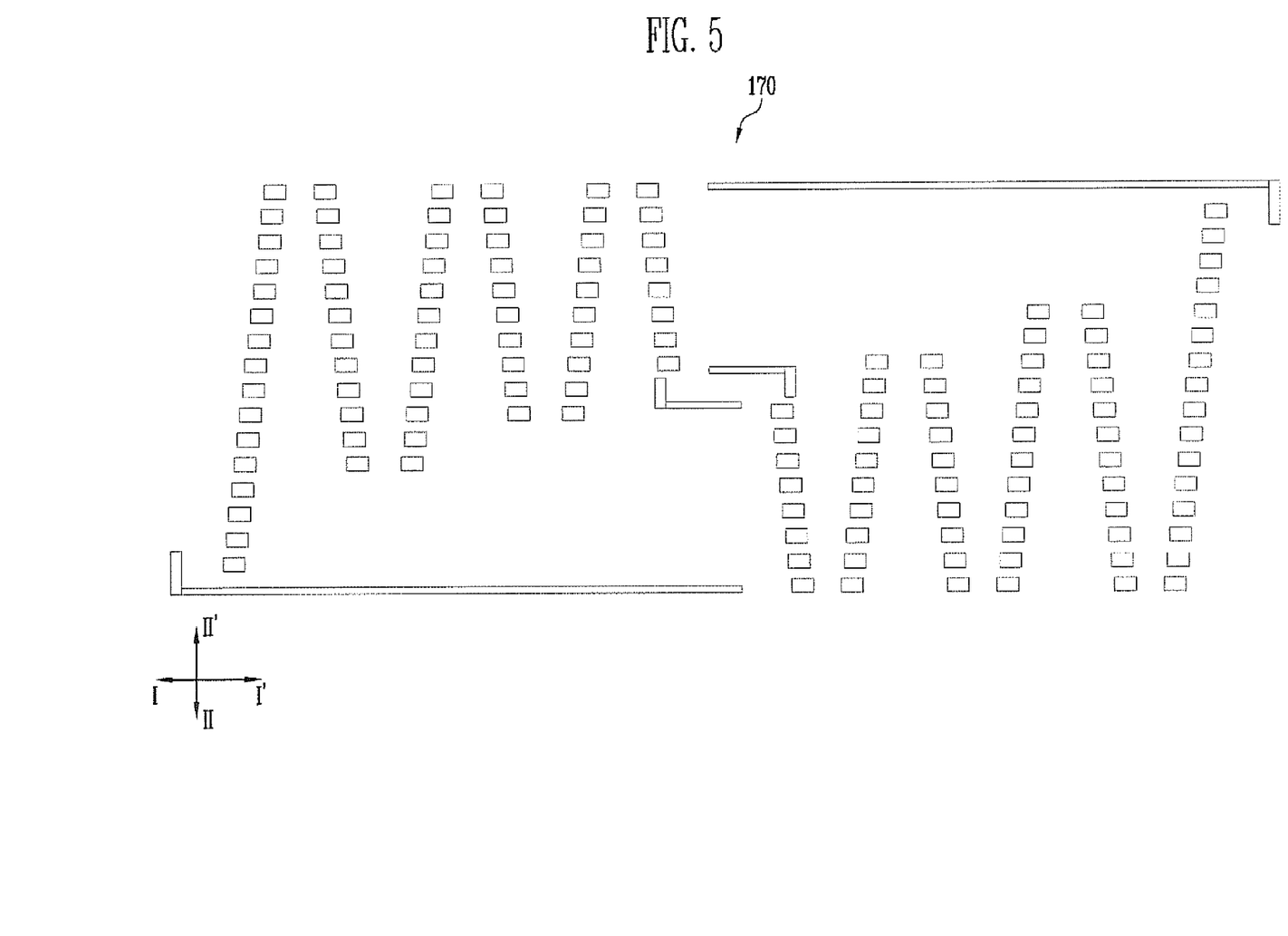
Figure 6:
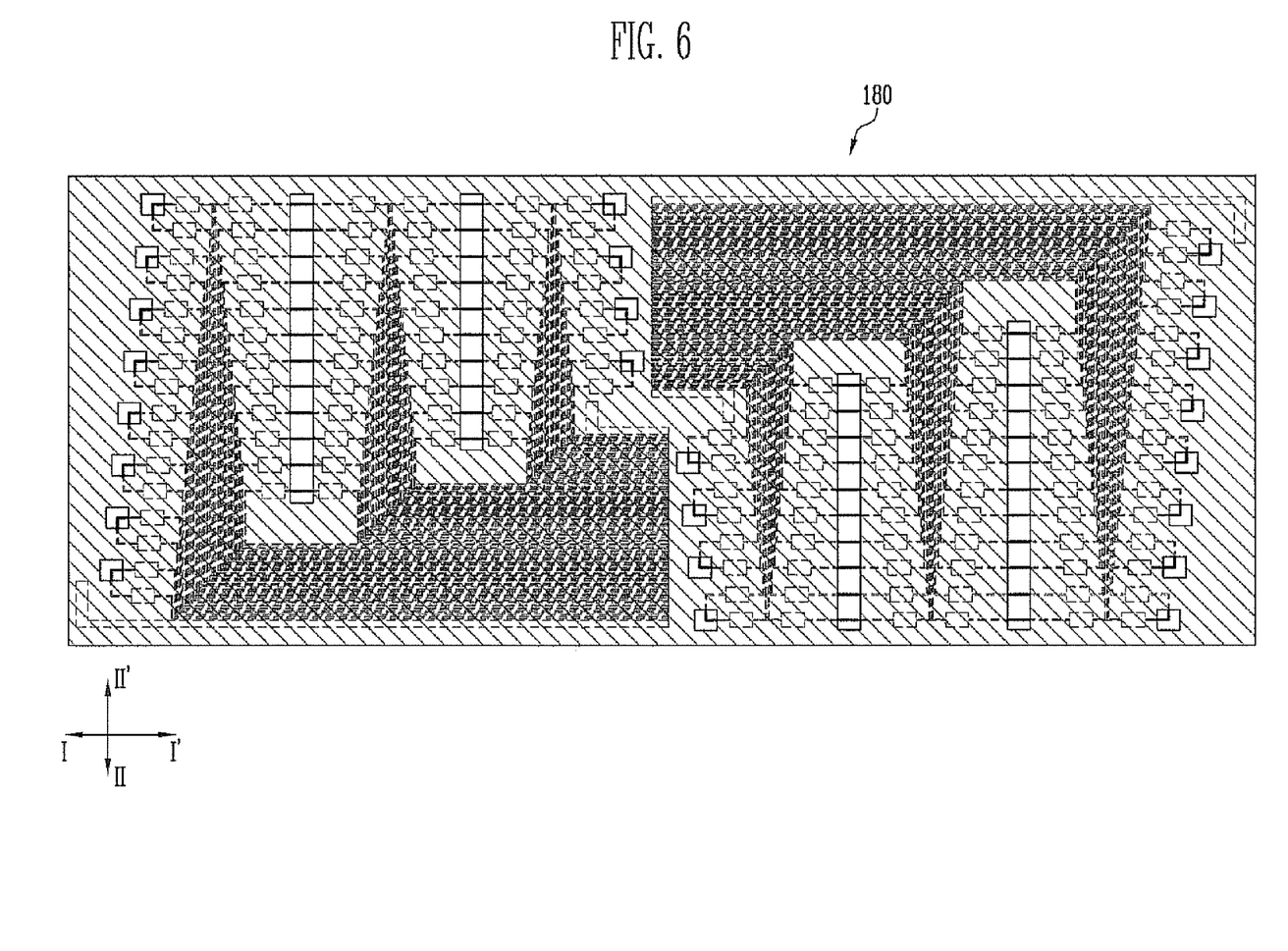

FIGS. 4 to 6 are diagrams illustrating the first mask pattern, the second mask pattern, and the third mask pattern according to an exemplary embodiment of the present invention, and especially represents the shapes of the first mask pattern, the second mask pattern, and the third mask pattern required when the conductive pattern of FIG. 1A is formed by the method described with reference to FIGS. 2A to 3G.

The embodiments disclosed in the present invention are intended to illustrate the scope of the technical idea of the present invention, and the scope of the present invention is not limited by the exemplary embodiment. The scope of the present invention shall be construed on the basis of the accompanying claims in such a manner that all of the technical ideas included within the scope equivalent to the claims belong to the present invention.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims.

What is claimed is:

1. A semiconductor device comprising:
    a plurality of conductive lines extending in parallel and each comprising a first region extending in a first direction and a second region coupled to the first region and extending in a second direction crossing the first direction; and
    a plurality of contact pads, each coupled to the second region of a respective one of conductive lines,
    wherein the plurality of conductive lines are grouped and arranged in a plurality of groups, the first region of a first group is longer than the first region of a second group, and the second region of the first group and the second region of the second group are spaced apart from each other, wherein each of the groups includes first to fourth conductive lines sequentially arranged, and the second regions of the second and third conductive lines have a longer length than the second regions of the first and fourth conductive lines, so that the second regions of the first to fourth conductive lines form a bisymmetric triangle shape.

2. The semiconductor device of claim 1, wherein the plurality of conductive lines included in the one group is bisymmetrically arranged based on the conductive line positioned at a center thereof.

3. The semiconductor device of claim 1, wherein in the plurality of conductive lines included in the one group, the conductive lines arranged in a left side of a center conductive line are coupled to the contact pads in a left side, and the conductive lines arranged in a right side of the center conductive line are coupled to the contact pads in a right side.

4. The semiconductor device of claim 1, wherein the plurality of contact pads are arranged in a space between the second region of the first group and the second region of the second group.

5. The semiconductor device of claim 1, wherein the conductive lines of the one group are included in one memory block, and each of the memory blocks includes selection lines having a wider width than that of the conductive line in both sides of the plurality of conductive lines.

6. The semiconductor device of claim 1, wherein each memory block includes the plurality of conductive lines shaped like "L", and the adjacent memory blocks are arranged in 180° rotated form and overlapped with each other.

* * * * *